United States Patent [19]
Kuhara et al.

[11] Patent Number: 5,063,348
[45] Date of Patent: Nov. 5, 1991

[54] MAGNETIC RESONANCE IMAGING SYSTEM

[75] Inventors: Shigehide Kuhara; Kozo Satoh, both of Yokohama, Japan

[73] Assignee: Kabushiki Kaisha Toshiba, Kawasaki, Japan

[21] Appl. No.: 484,048

[22] Filed: Feb. 23, 1990

[30] Foreign Application Priority Data

Feb. 23, 1989 [JP] Japan ................................. 1-43504

[51] Int. Cl.$^5$ ............................................. G01V 3/00
[52] U.S. Cl. ................................... 324/307; 324/309
[58] Field of Search ............... 324/307, 309, 312, 318, 324/322; 128/653 A

[56] References Cited

U.S. PATENT DOCUMENTS

| | | | |
|---|---|---|---|
| 4,665,366 | 5/1987 | Macovski | 324/307 |
| 4,734,648 | 3/1988 | Machida et al. | 324/307 |
| 4,772,850 | 9/1988 | Kasugai | 324/309 |
| 4,862,083 | 8/1989 | McKinnon et al. | 324/307 |

FOREIGN PATENT DOCUMENTS

| | | |
|---|---|---|
| 0107294 | 5/1984 | European Pat. Off. |
| 0144026 | 6/1985 | European Pat. Off. |
| 0335981 | 10/1989 | European Pat. Off. |
| 60-179643 | 9/1985 | Japan |
| 63-171552 | 7/1988 | Japan |

OTHER PUBLICATIONS

"Doubly Tuned Local Coils for MRI and MRS at 1.5T", vol. 6, No. 3, Magnetic Resonance in Medicine, T. M. Grist et al., Mar. 1988, pp. 253-264.

Primary Examiner—Hezron E. Williams
Assistant Examiner—Louis M. Arana
Attorney, Agent, or Firm—Oblon, Spivak, McClelland, Maier & Neustadt

[57] ABSTRACT

In an MRI system, an RF field and slicing, phase encoding, and read-out gradient fields are applied to an object to be examined which is placed in a homogeneous static field in a predetermined sequence. An MR signal from a region of interest in the object is received through a probe, and is detected by a detection circuit using a predetermined reference wave. A detection output from the synchronous detection circuit is sampled to acquire MR signal data and to obtain diagnostic data. The system includes a reference wave control section for shifting the frequency and phase of the reference wave, by predetermined amounts, from the frequency and phase of an MR signal when the phase encoding and read-out gradient fields are zero. The reference wave control section changes a frequency shift value of the reference wave to positive and negative phases in synchronism with switching of the gradient fields, and changes a phase shift value of the reference wave stepwise.

12 Claims, 11 Drawing Sheets

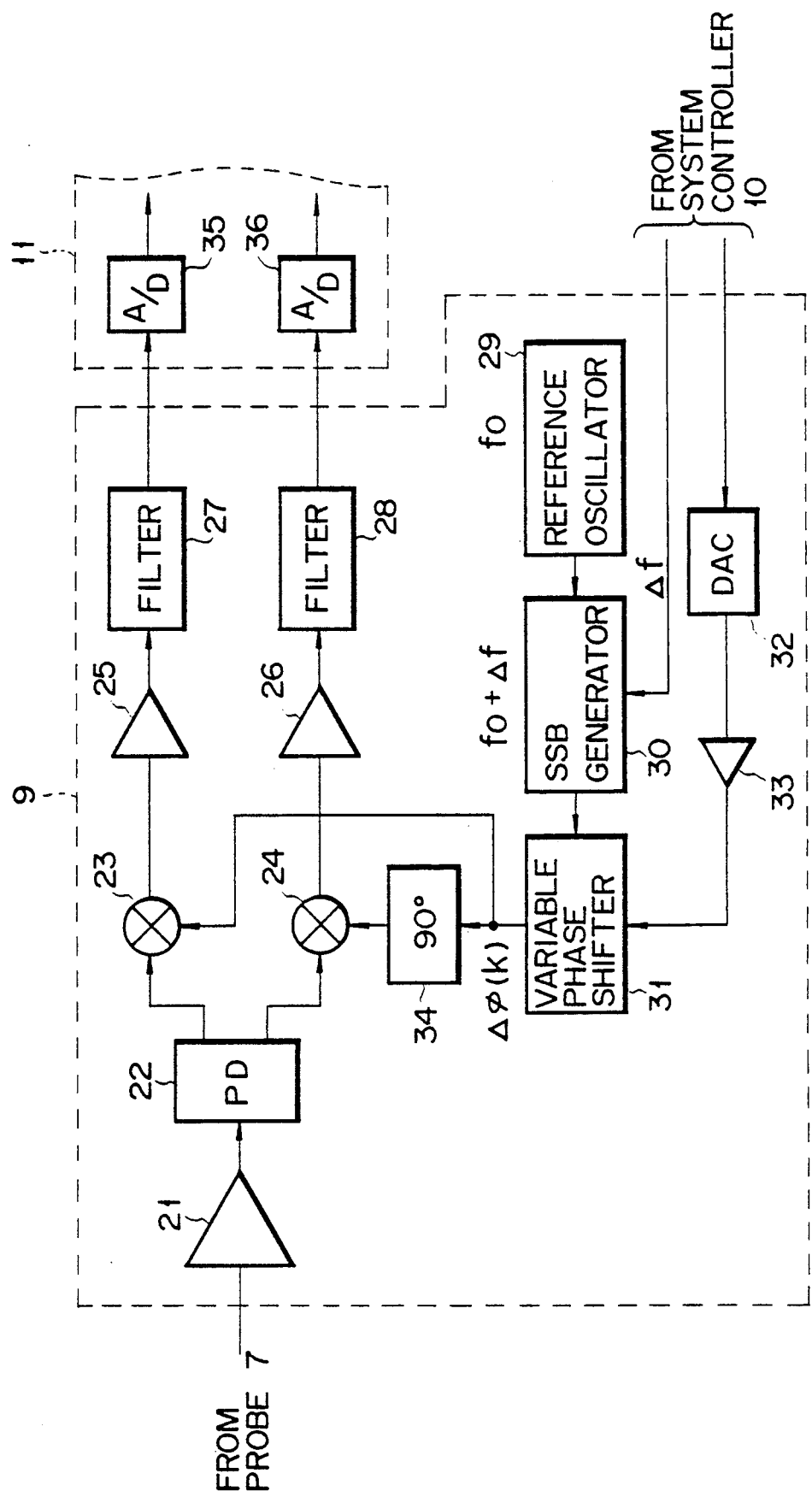
F I G. 3

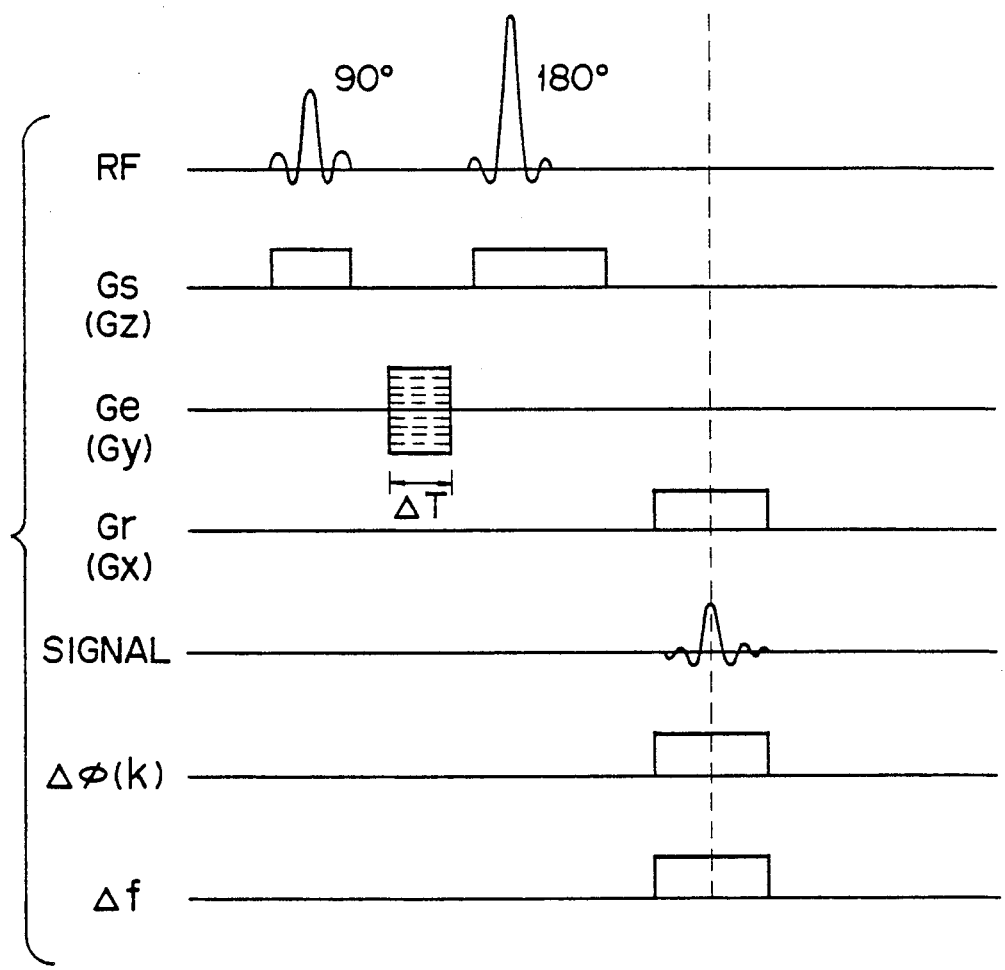
F I G. 4

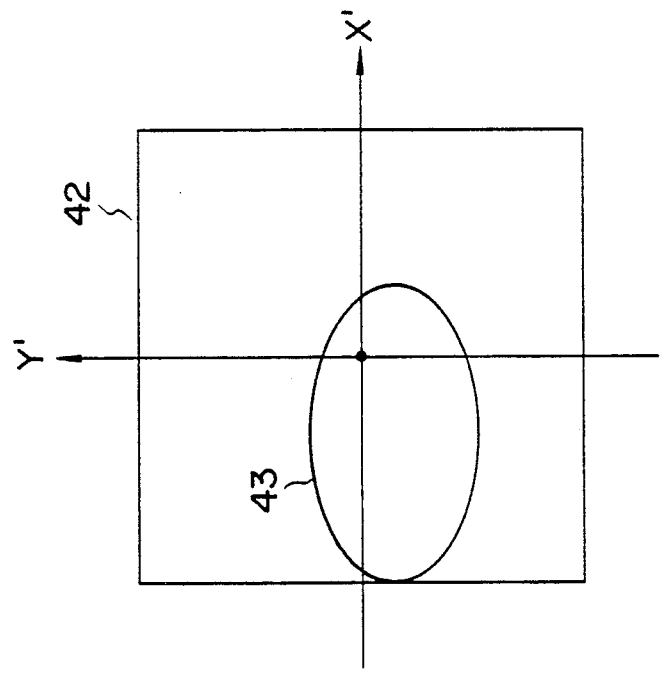
F I G. 5B
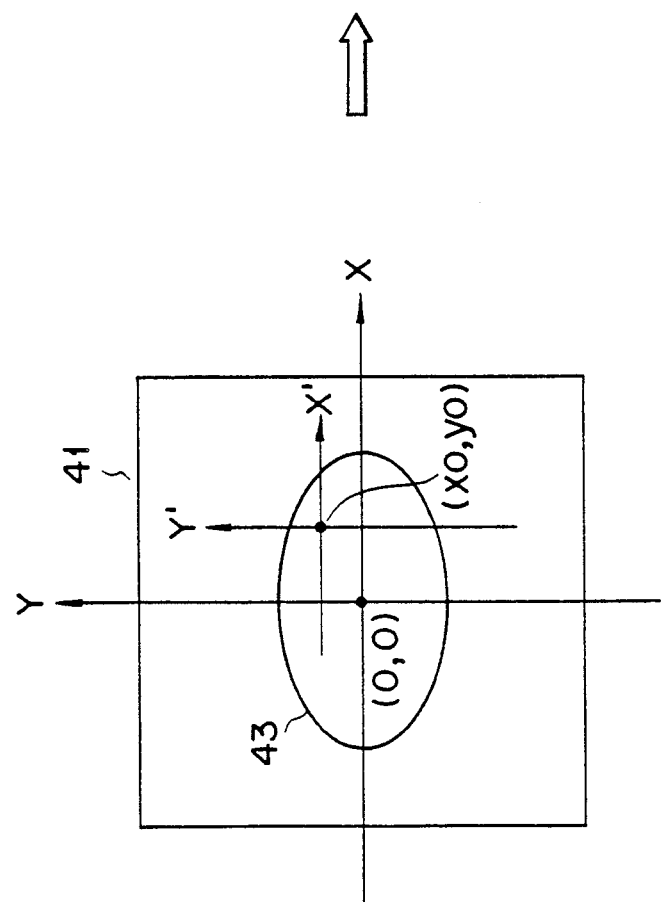
F I G. 5A

MAGNETIC RESONANCE IMAGING SYSTEM

BACKGROUND OF THE INVENTION

1. Field of the Invention

The present invention relates to a magnetic resonance imaging (MRI) system and, more particularly, to system having an arrangement suitable for enlargement zoom imaging.

2. Description of the Related Art

MRI systems for obtaining image data by MRI have been increasingly used for, e.g., medical diagnosis. Generally, in such an MRI system, an object to be examined is placed in a homogeneous static field, and an RF field, a slicing gradient field, a phase encoding gradient field, and a read-out gradient field are superposed on the homogeneous static field and are applied to the object in a predetermined sequence so as to excite magnetic resonance (MR) in the object. With this operation, MR signal data generated from a region of interest in the object are acquired, and the data of the region of interest are visualized to obtain diagnostic data.

In such an MRI system, in order to observe a region of interest, e.g., a morbid portion in detail, enlargement zoom imaging is sometimes performed to obtain an enlarged image formed by arbitrarily enlarging a region of interest. In a conventional enlargement zoom imaging technique, however, if a region of interest is deviated from the center of an imaging area (acquisition area of MR signal data) (i.e., if the central position of the region of interest does not coincide with that of the imaging area), the image of the region of interest extends outside an image plane (i.e., a display screen) as the magnification is increased. The image portion extending beyond the image plane does not satisfy the Nyquist condition, so that in many cases such an image portion becomes artifact of aliasing on the opposite side of the image plane. In such cases, therefore, it is difficult to increase the magnification.

Enlargement zoom imaging is generally performed by increasing the gradient strengths of phase encoding and read-out gradient fields when a data acquiring period is constant. However, if the gradient strengths are simply increased, the signal band of MR signals expands, and the Nyquist condition may not be satisfied. For example, if a region of interest of an object to be examined is deviated from the center of an imaging area, an artifact 72' due to aliasing is formed on the opposite side to an image 72 (to be obtained) of the object in an MR signal data acquisition area 71 on a Fourier plane, as shown in FIG. 1. In addition, even in a local excitation method, if a locally-excited region is deviated from the center of an image, the same problem as described above is posed when the resolution of an image is increased by increasing gradient strengths.

If an enlarged region of interest is located within the imaging region, what is required is only to prevent aliasing of the image portions other than the region of interest. In such a case, the above-noted problem can be easily solved by eliminating unnecessary band components by use of a filter. However, the elimination of unnecessary band components is not effective if the region of interest extends beyond the imaging region. In this case, the above-noted problem is solved in principle by increasing the sampling rate of MR signals in a fixed data collection time, mainly in the read direction. By so doing, the number of sampling points increases and the number of data points in the Fourier transformation increases, so that the Nyquist condition can be satisfied. As a result, it is possible to produce a high-resolution image which is substantially equivalent to that obtained by performing local zooming. However, since a very high sampling rate is used in the ultra high speed imaging method, it is difficult to further increase of the sampling rate of the high-bit A/D converter employed in the system, in light of the restrictions imposed by the hardware arrangement.

An artifact due to aliasing in the phase encoding direction can be prevented by decreasing the pitch of multistep encoding. With this operation, however, the number of encoding steps needed for obtaining the same imaging area is increased. Especially in an ultra high speed imaging method, since the acquisition time of MR signal data is limited by, e.g., countermeasures against the movement of an object to be examined and limitations associated with the transverse relaxation time (T*2), it is difficult to increase the number of encoding steps.

SUMMARY OF THE INVENTION

As described above, in the conventional MRI systems, if the center of a region of interest is deviated from the center of an imaging area in enlargement zoom imaging, since the image of the region of interest extends outside a display screen if the magnification is increased greatly, it is difficult to set large magnifications.

In addition, if the gradient strength of a gradient field is increased for enlargement zoom imaging or ultra high speed imaging, and if the center of a region of interest of an object to be examined is deviated from the center of an acquisition area of MR signal data, the Nyquist condition cannot be satisfied upon expansion of a signal band, and an artifact due to aliasing is produced.

In an ultra high speed imaging method, such as an echo planar method or an ultra high speed Fourier method, a very high sampling rate is used. Therefore, in light of the hardware arrangement employing a high-bit A/D converter, it is difficult to further increase the sampling rate of MR signals, so as to satisfy the Nyquist condition in the read direction.

The technique of preventing aliasing in the phase encoding direction by decreasing the pitch of multistep encoding (and increasing the number of encoding steps) is difficult to employ when the number of encoding steps cannot be increased as in, e.g., ultra high speed imaging.

It is an object of the present invention to provide an MRI system which can solve the above-described problem and can obtain data of a region of interest even if the magnification is increased in enlargement zoom imaging.

It is another object of the present invention to provide an MRI system which can obtain high-resolution diagnostic data having no artifacts due to aliasing without greatly increasing the sampling rate of MR signals and increasing the number of steps for phase encoding.

In an MRI system according to the present invention, a desired region of interest can be positioned at the center of a screen by shifting the center of an area for receiving and acquiring MR signal data by a predetermined amount from a point where a gradient field is zero.

According to the first aspect of the present invention, there is provided a system for receiving an MR signal from a region of interest in an object to be examined, causing a synchronous detection circuit to detect the MR signal by using a predetermined reference wave, and sampling a detection output from the synchronous detection circuit, thereby acquiring MR signal data and obtaining MR data, wherein the frequency and phase of the reference wave are shifted, by predetermined amounts, from the frequency and phase of an MR signal when the phase encoding and read-out gradient fields are zero in order to shift the center of an acquisition area of MR signal data by a predetermined amount from a point where the gradient fields are zero.

According to the second aspect of the present invention, there is provided a system which employs a sequence of an ultra high speed imaging operation using high-speed inversion switching of a read-out gradient field, the system being adapted to receive an MR signal from a region of interest in an object to be examined, cause a synchronous detection circuit to detect the MR signal by using a predetermined reference wave, and sample a detection output from the synchronous detection circuit, thereby acquiring MR signal data and obtain MR data, wherein when the frequency and phase of the reference wave are shifted, by predetermined amounts, from the frequency and phase of an MR signal when the phase encoding and read-out gradient fields are zero, a frequency shift amount of the reference wave is changed to the positive and negative phases in synchronism with inversion switching of the gradient fields, and a phase shift amount of the reference wave is changed stepwise for each inversion switching of the gradient fields, thereby shifting the center of an acquisition area of MR signal data by a predetermined amount from a point where the gradient fields are zero.

According to the MRI system of the present invention, since the center of an acquisition area of MR signal data, i.e., the center of an imaging area is shifted by a predetermined amount from a point where the gradient fields are zero, the center of an image is shifted from the point where the gradient fields are zero. If the center of the imaging area is matched with a region of interest in this manner, the region of interest is located at the center of a screen. Therefore, even if enlargement zoom imaging is performed at a large magnification, extension of the region of interest outside the screen can be prevented.

In addition, according to this system, since the frequency and phase of a reference wave used for synchronous detection of an MR signal are shifted, by predetermined mounts, from the frequency and phase of an MR signal when the phase encoding and read-out gradient fields are zero, the center of an imaging area is shifted from the point, where the gradient fields are zero, in accordance with the shift amounts of the frequency and phase of the reference wave. In this case, even if the frequency of an MR signal is increased by increasing a gradient strength for, e.g., enlargement zoom imaging or for an increase in resolution, since the frequency of a detection output from the synchronous detection circuit is decreased upon frequency shift of the reference wave, the Nyquist condition can be satisfied in the next sampling system (A/D converter). This prevents an artifact due to aliasing in the read direction. An artifact due to aliasing in the phase encoding direction can be also prevented by the phase shift of the reference wave.

According to the system of the present invention, even if the magnification is increased for enlargement zoom imaging, data of a region of interest can be completely obtained. In addition, high-resolution MR data having no artifacts due to aliasing can be obtained without greatly increasing the sampling rate of MR signals and increasing the number of steps of phase encoding.

BRIEF DESCRIPTION OF THE DRAWINGS

FIG. 3 is a block diagram showing a detailed arrangement of a main part of the system in FIG. 2;

FIG. 4 is a timing chart showing a pulse sequence for imaging in the system in FIG. 2;

FIGS. 5A and 5B are graphs for explaining an operation in which the center of an MR signal data acquisition area is moved in the system in FIG. 2;

DETAILED DESCRIPTION OF THE PREFERRED EMBODIMENTS

Figure 2:
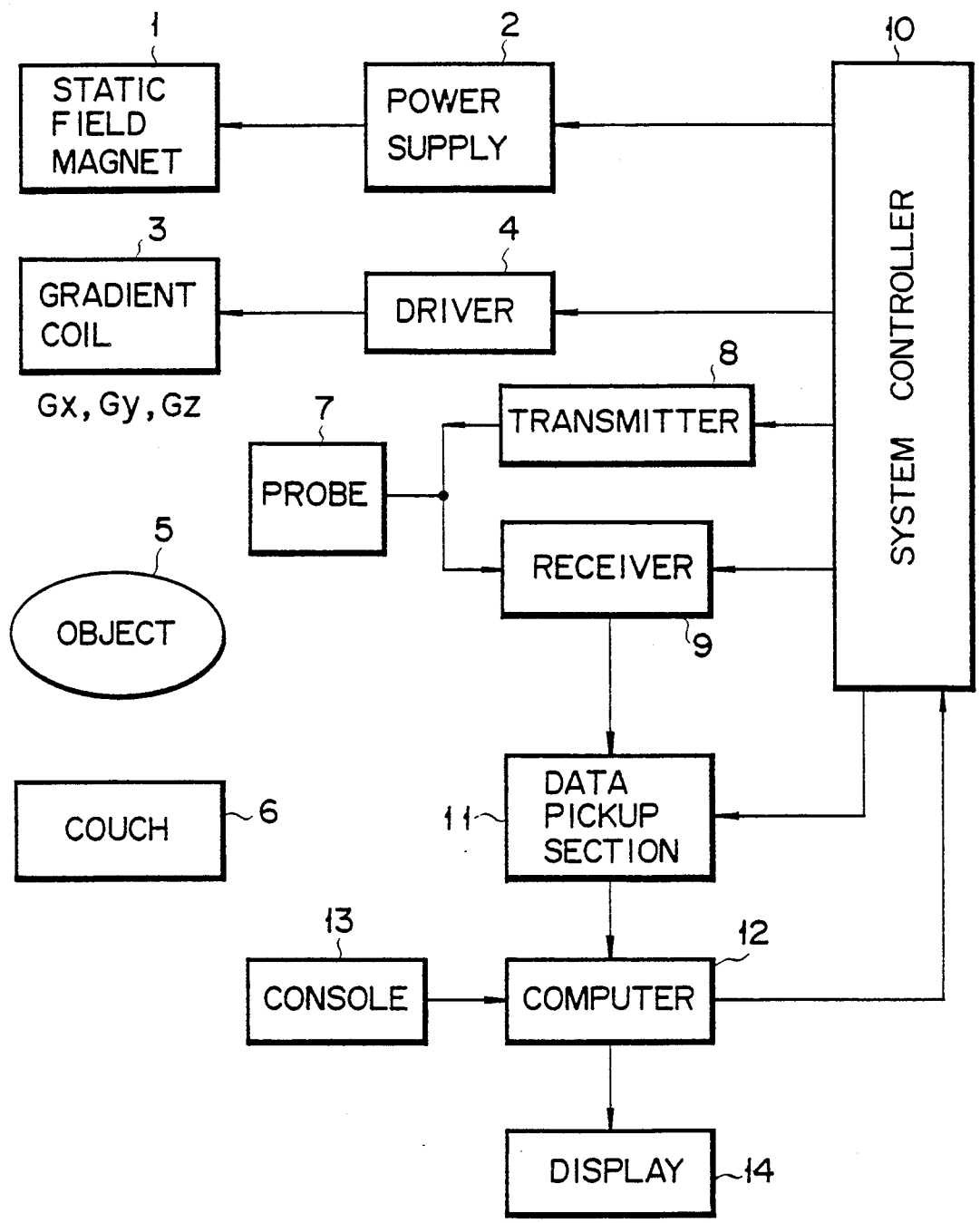
FIG. 2 is a block diagram showing an arrangement of an MRI system according to the first embodiment of the present invention.

FIG. 2 shows an arrangement of an MRI system according to the first embodiment of the present invention.

A static field magnet 1 and a gradient coil 3 are respectively driven and excited by a power supply 2 and a driver 4. When the static field magnet 1 and the gradient coil 3 are excited, a homogeneous static field and gradient fields Gx, Gy, and Gz are applied to an object 5 to be examined. The gradient fields Gx, Gy, and Gz respectively have linear gradient field distributions in orthogonal x, y, and z directions in the same direction as that of the static field.

A probe 7 receives an RF signal from a transmitter 8 and applies an RF field to the object 5. In addition, the probe 7 receives an MR signal generated in the object 5. Note that the probe 7 may be constituted by a single coil used for signal transmission and reception or by two exclusive coils respectively used for signal transmission and reception.

An MR signal detected by the probe 7 is amplified and detected by a receiver 9 and is transmitted to a data pickup section 11. The signal is converted into a digital signal, as MR signal data, by an A/D converter in the data pickup section 11. The MR signal data is then supplied to a computer 12.

The power supply 2, the driver 4, the transmitter 8, and the receiver 9 are all controlled by a system controller 10. The computer 12 controls the system controller 10 in accordance with an instruction supplied from a console 13 upon operation of an operator. In the computer 12, processing including Fourier transform is performed for the MR signal data supplied from the data pickup section 11, and the density distribution of desired specific atomic nuclei in the object 5 or other MR data distributions are calculated, thereby obtaining image data. The image data obtained in this manner is displayed on a display 14 as an image.

FIG. 3 shows a detailed arrangement of the receiver 9.

After the MR signal detected by the probe 7 (see FIG. 2) is amplified by an RF amplifier 21, the amplified signal is divided into two components by a power distributor 22, and the divided components are input to two synchronous detection circuits 23 and 24.

The synchronous detection circuits 23 and 24 respectively multiply two reference waves having a phase difference of 90°, as reference waves, by the input MR signals so as to perform synchronous detection of the respective reference waves. Output signals from the circuits 23 and 24 are amplified by DC amplifiers 25 and 26, respectively. Unnecessary components of the signals are then removed by filters 27 and 28 so as to form MR signal detection outputs. These signals are supplied to the data pickup section 11 (see FIG. 2) and are respectively converted in digital data by A/D (analog-to-digital) converters 35 and 36.

A reference oscillator 29 generates a reference signal having a frequency fo used as a reference for reference waves to be supplied to the synchronous detection circuits 23 and 24. A reference signal output from the reference oscillator 29 is frequency-shifted by an SSB (single side band) generator 30, and is subsequently supplied to a variable phase shifter 31. The variable phase shifter 31 receives an output from a D/A converter 32, as a control voltage, through a buffer 33, and phase-shifts the output signal from the SSB generator 30 in accordance with the control voltage. An output from the variable phase shifter 31 is branched into two ways. One output is supplied to the synchronous detection circuit 23 as a reference wave, and the other output is phase-shifted by a 90° phase shifter 34 and is subsequently input to the synchronous detection circuit 24 as a reference wave.

A frequency shift amount $\Delta f$ of the SSB generator 30 is controlled by the system controller 10. Similarly, a phase shift amount $\Delta\phi(t)$ of the variable phase shifter 31 is controlled by the system controller 10 through the D/A converter 32 and the buffer 33.

In an arrangement of a conventional system, the SSB generator 30, the variable phase shifter 31, the D/A converter 32, and the buffer 33 in FIG. 3 are generally omitted, and hence an output from the reference oscillator 29 is directly supplied to the reference wave input of the synchronous detection circuit 23 and the 90° phase shifter 34. In contrast to this, in this embodiment, the frequency and phase of each reference wave can be shifted, as described above.

A pulse sequence for imaging in the system of the embodiment will be described below with reference to FIG. 4.

A 90° selective excitation pulse is applied as an RF field RF in the first place. At the same time, a slicing gradient field Gs (Gz) is applied in the z-axis direction so as to selectively excite magnetization in a slice portion. Thereafter, in order to convert the position of the slice portion on the y-axis direction into the phase of an MR signal, a phase encoding gradient field Ge (Gy) is applied. The phase encoding gradient field Ge (Gy) is a gradient field in the y-axis direction perpendicular to the direction of the slicing gradient field Gs. A read-out gradient Gr (Gx) for reading an MR signal is applied to receive and detect the MR signal. The read-out gradient field is a gradient field in the x-axis direction perpendicular to the slicing and phase encoding gradient fields Gs and Ge. The MR signal received and detected in this manner is A/D-converted and is acquired as MR signal data.

Subsequently, substantially the same sequence as described above is repeatedly performed by changing the strength of the phase encoding gradient field Ge stepwise as indicated by dotted lines, thus acquiring MR signal data required for the generation of a two-dimensional image. An MR image is obtained on the basis of the MR signal data.

In this embodiment, imaging based on the above-described sequence is performed by using the arrangement shown in FIG. 3 in the following manner. As shown in FIG. 4, the frequency of a synchronous detection reference wave is shifted from fo by $\Delta f$ in synchronism with the application timing of the read-out gradient field Gr (the reception/detection timing of an MR signal). In addition, the phase of the synchronous detection reference wave is shifted stepwise for, e.g., each step of multistep phase encoding, as indicated by $\Delta\phi(k)$ in FIG. 4. That is, the phase is shifted stepwise every time the phase encoding gradient field Ge is changed stepwise. In this case, $\Delta f$ and $\Delta\phi(k)$ respectively set according to equations (1) and (2):

$$\Delta f = \gamma Gx \cdot xo / 2\pi \tag{1}$$

$$\Delta\phi(k) = \gamma Gy \cdot yo \cdot \Delta T \cdot K \tag{2}$$

$\gamma$: nuclear gyromagnetic ratio
Gx: gradient strength of gradient field (Gr) in x direction
Gy: gradient strength of gradient field (Ge) in y direction
k: number of steps of multistep phase encoding ($k = \pm 1, \pm 2, \ldots \pm n$)
$\Delta T$: application time of phase encoding gradient field Ge In this case, as shown in FIGS. 5A and 5B, the central position of an image on a Fourier plane (the central position of an area for acquisition of MR signal data) is shifted from a point $(x,y) = (0,0)$, which corresponds to the frequency and phase of an MR signal at the position where the phase encoding and read-out gradient fields Ge and Gs are zero, to $(x,y) = (xo,yo)$. FIGS. 5A and 5B respectively show imaging areas 41 and 42 before and after the shift operation, and an image 43 of an object to be examined.

The phase of a reference wave is changed for each step of multistep phase encoding for the following reason.

Figure 1:
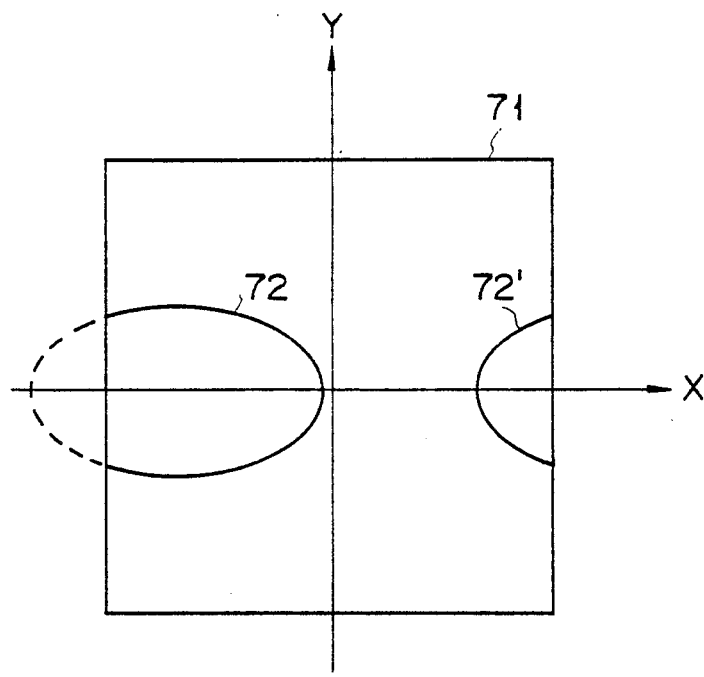
FIG. 1 is a view for explaining a problem in a conventional MRI system.
Figure 7:
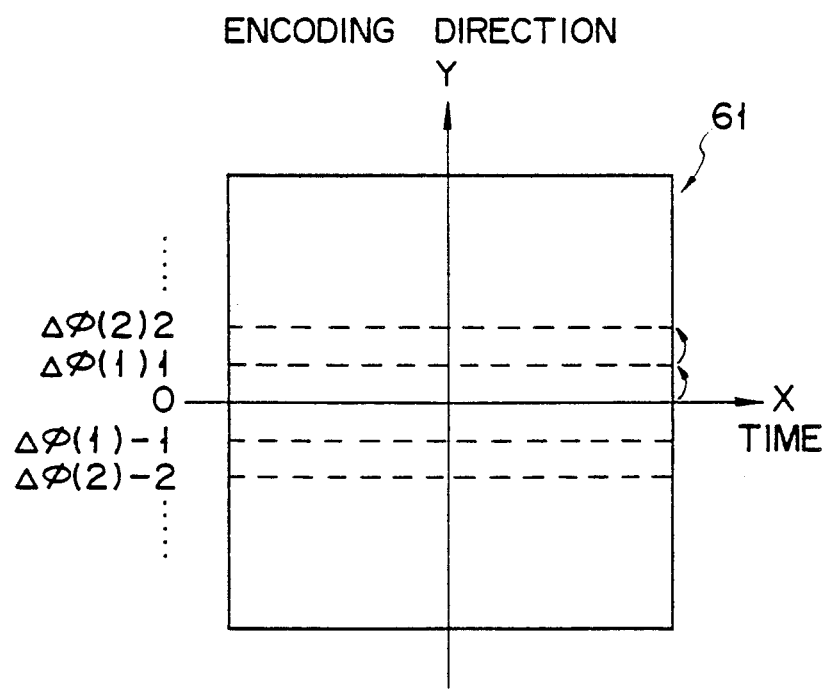
FIG. 7 is a graph for explaining a relationship between phase encoding steps and phase shifts of a synchronous detection reference wave on a Fourier plane in the system in FIG. 2.

Referring to FIG. 5A, the phase of the MR signal obtained at the point (x,y)=(0,0) is constant in any step of any phase encoding because the phase encoding gradient field Ge at this point is zero. In contrast to this, MR signals obtained at points other than the point (x,y)=(0,0), i.e., points where the phase encoding gradient Ge is not zero vary in phase depending on the strength of the phase encoding gradient field Ge. That is, as the gradient field Ge is changed, the phase of an MR signal at the same position is changed. Therefore, the center of the MR signal data acquisition area can be set at the point (x,y)=(xo,yo) by shifting the phase of the synchronous detection reference wave in units of $\Delta\phi(k)$ for each step of phase encoding in accordance with a change in the gradient field Ge in such a manner that the phases of each MR signal viewed from this point is constant, as shown in FIG. 7. This processing is expressed by equation (2).

If enlargement zoom imaging is performed by increasing, e.g., the gradient strengths (Gy and Gx) of the phase encoding and read-out gradient fields Ge and Gs to values larger than normal values while the frequency and phase of a synchronous detection reference wave are shifted in the above-described manner, since the point (x,y)=(xo,yo) coincides with a region of interest, the image of the region of interest can be enlarged without causing it to extend outside the screen.

Figure 6B:
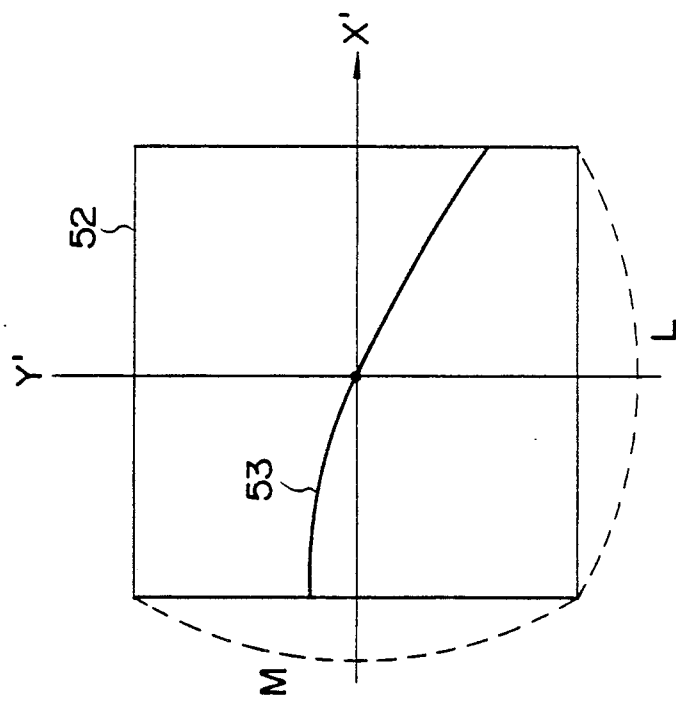
FIGS. 6A and 6B are graphs for explaining an operation in which the MR signal data acquisition area is moved and enlargement zoom imaging of a region of interest is performed.
Figure 6A:
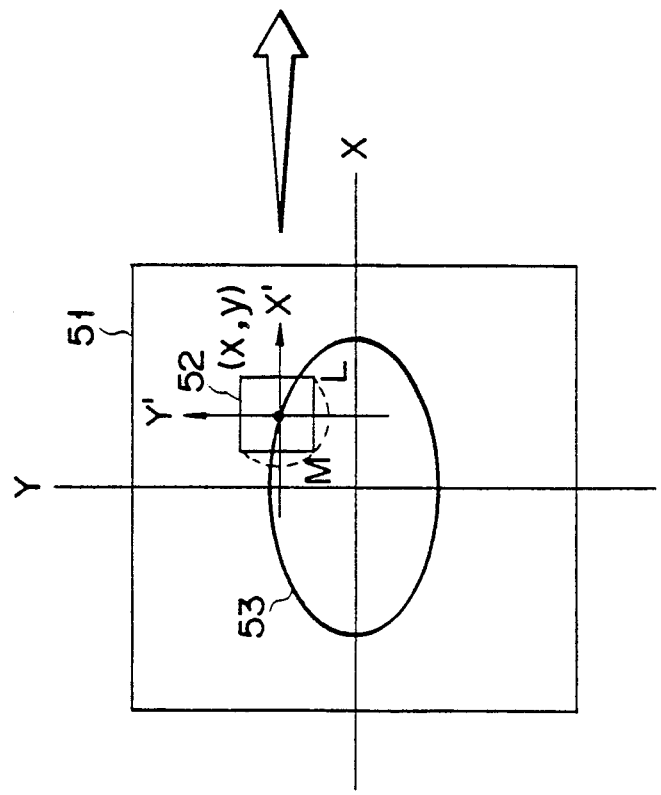

FIGS. 6A and 6B show enlargement zoom imaging on a Fourier plane. FIGS. 6A and 6B respectively show imaging areas 51 and 52 before and after a shift operation (before and after enlargement zooming), and an image 53 of an object to be examined. More specifically, the area 52 having a size of M×L and the center which coincides with the center (x,y)=(xo,yo) of the imaging area 51 (in FIG. 6A) shifted by shifting the frequency and phase of a reference wave is enlarged and displayed, as shown in FIG. 6B. Therefore, by matching the area 52 with a region of interest, the region of interest can be enlarged and displayed without extending outside the screen, and diagnosis is facilitated.

When such enlargement zoom imaging is to be performed, since the gradient strengths Gy and Gx are increased as described above, the frequency of an MR signal is increased, and the Nyquist condition may not be satisfied. In the present invention, however, such a problem can be solved by shifting the frequency and phase of a synchronous detection reference wave for the following reason.

Generally, when enlargement zoom imaging is not performed (the gradient strengths are not increased), if the frequency of an MR signal when the gradient fields Ge and Gr are zero is represented by fr; the maximum frequency of an MR signal, by fp; the reference frequency of a reference wave in each synchronous detection circuit, by fo; and the sampling frequency of the A/D converters 35 and 36, by fs, the frequencies fo and fr are equal to each other, and the frequency fs is set to be twice a maximum frequency fp−fo of synchronous detection output or more, i.e., 2(fp-fo) or more. More specifically, these frequencies are set as, e.g., fr=64 MHz, fp=64.02 MHz, fo=64 MHz, and fs=40 kHz. In this case, the signal band of the data pickup section 11 is 0 to 20 kHz.

Assume that the resolution is increased by increasing the gradient strengths Gy and Gx in order to perform, e.g., enlargement zoom imaging, and the maximum frequency fp of an MR signal becomes 64.03 MHz. In this case, since the maximum frequency fp−fo of a synchronous detection output is 30 kHz and hence is higher than fs/2=20 kHz, and the Nyquist condition is not satisfied, aliasing of a component of 40 kHz - 30 kHz=10 kHz occurs in the signal band (0 to 20 kHz), resulting in an artifact.

According to the present invention, however, even if the maximum frequency fp of an MR signal is set at 64.03 MHz by increasing the gradient strengths Gy and Gx, since the frequency of a reference wave of each synchronous detection circuit is shifted from fo to fo+$\Delta$f, e.g., $\Delta$f=10 kHz, the maximum frequency of a synchronous detection output is set at 64.03 MHz−(64 MHz+10 kHz)=20 kHz and falls within the signal band. Therefore, no artifact due to aliasing is produced.

Similarly, aliasing in the phase encoding direction can be prevented by shifting the phase of a reference wave for each encoding step, as indicated by equation (2).

A system according to the second embodiment of the present invention in which the present invention is applied to ultra high speed MRI will be described below.

Similarly, local zooming in ultra high speed MRI can be performed in principle by changing the frequency and phase of a reference wave in the read and encoding directions, respectively, in accordance with a distance to a position to which the center of an imaging area is to be shifted. The second embodiment is different from the first embodiment in that since a read-out gradient field is inverted to the positive and negative polarities, a reception frequency is changed to the positive and negative phases with reference to the center of an image to be obtained. Therefore, the frequency of a reference wave must be changed to the positive and negative phases in synchronism with the switching of this gradient field. In this case, the frequency must be changed to the positive and negative phases so as to ensure continuity of phases. With regard to the phase of a reference wave, a phase shift of $\Delta\Phi(k)=\Delta\phi\cdot k$ is performed for each step of phase encoding.

Figure 8:
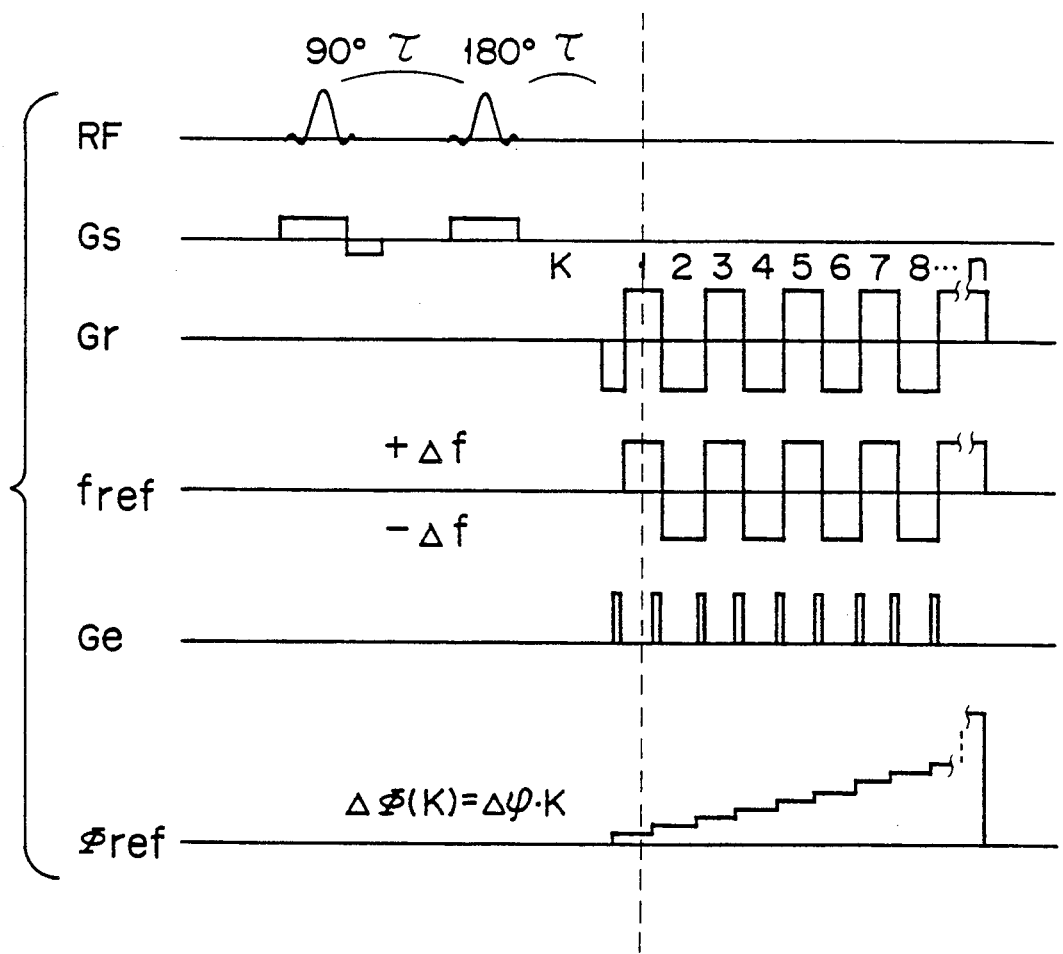
FIG. 8 is a timing chart for explaining an imaging sequence in a local zooming method in the second embodiment of the present invention in which the present invention is applied to ultra high speed MRI.

FIG. 8 shows a pulse sequence for imaging in this case. FIG. 8 shows an imaging sequence used for a half encode method, in which only MR data corresponding to one half of a Fourier plane are actually acquired as complex number data, and MR data corresponding to the other half is obtained by calculating the complex conjugates of these data.

While a static field is applied to an object to be examined, the sequence shown in FIG. 8 is executed. While a slicing gradient field Gs is applied to the object, a 90° pulse is applied to the object. A 180° pulse is then applied to the object while the slicing gradient field Gs is applied to the object. Subsequently, a read-out gradient field Gr is applied to the object while it is switched to the positive and negative polarities (its amplitude polarities, i.e., gradient directions are switched). A frequency fref of a reference wave is switched to fo+$\Delta$f and fo−$\Delta$f in synchronism with the inversion switching of the read gradient field Gr. As shown in FIG. 8, an encoding gradient field Ge is applied to the object in the form of a pulse having a narrow time width in synchronism with the inversion switching of the read-out gradient field Gr. In addition, a phase $\Phi$ref of the reference wave is shifted stepwise by $\Delta\Phi(k)=\Delta\phi\cdot k$ for each inversion switching of the read-out gradient field Gr.

Figure 9:
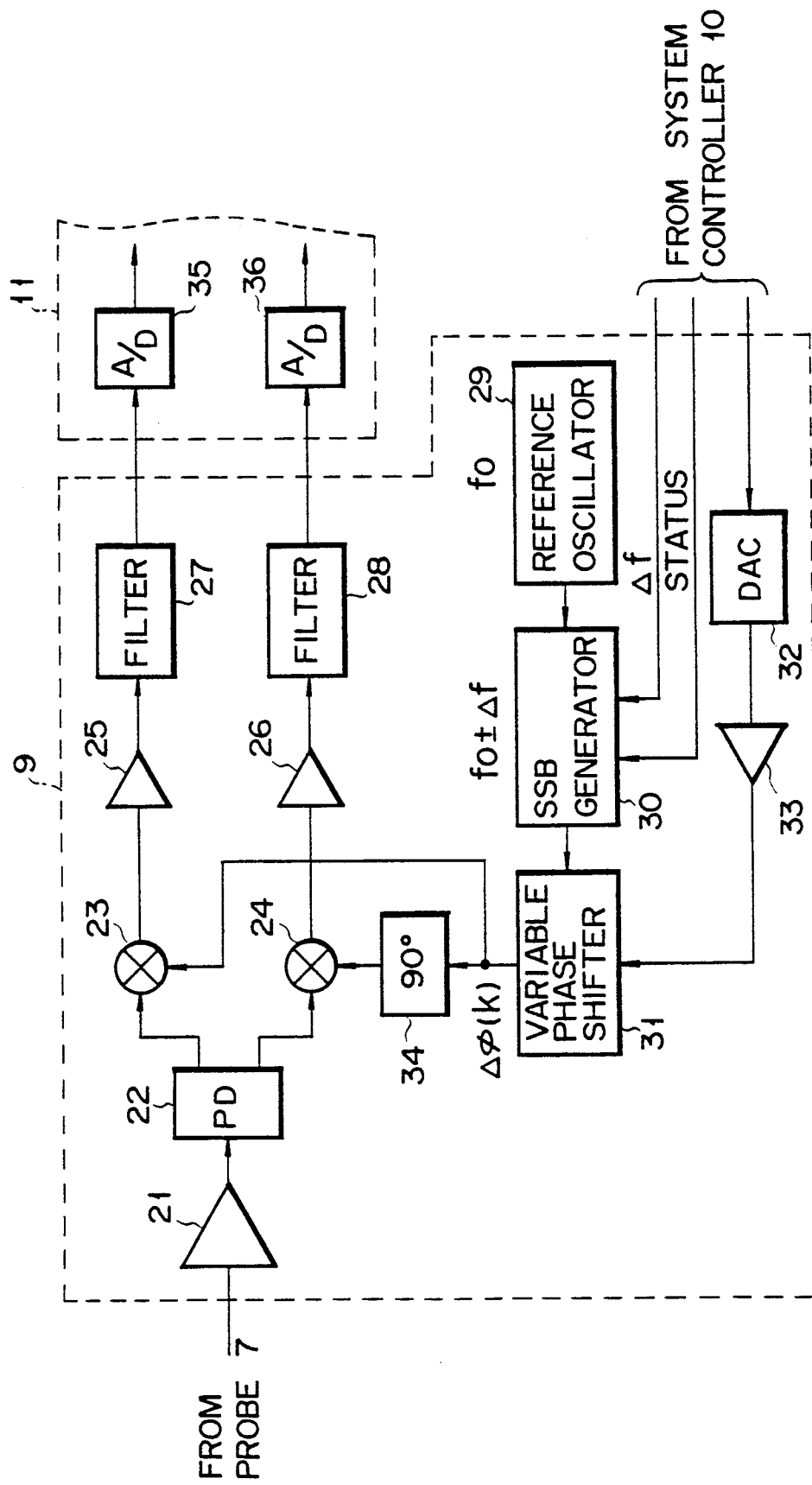
FIG. 9 is a block diagram showing a detailed arrangement of a main part of an MRI system according to the second embodiment of the present invention.

FIG. 9 shows an arrangement of a main part of the system for executing such a sequence.

The arrangement shown in FIG. 9 is different from that shown in FIG. 3 in that the following two types of signals are supplied, as input signals, from a system controller 10 to an SSB generator 30: a Δf signal representing a frequency shift amount Δf; and a status signal representing the polarity of the read-out gradient field Gr and a timing of switching.

Figure 10:
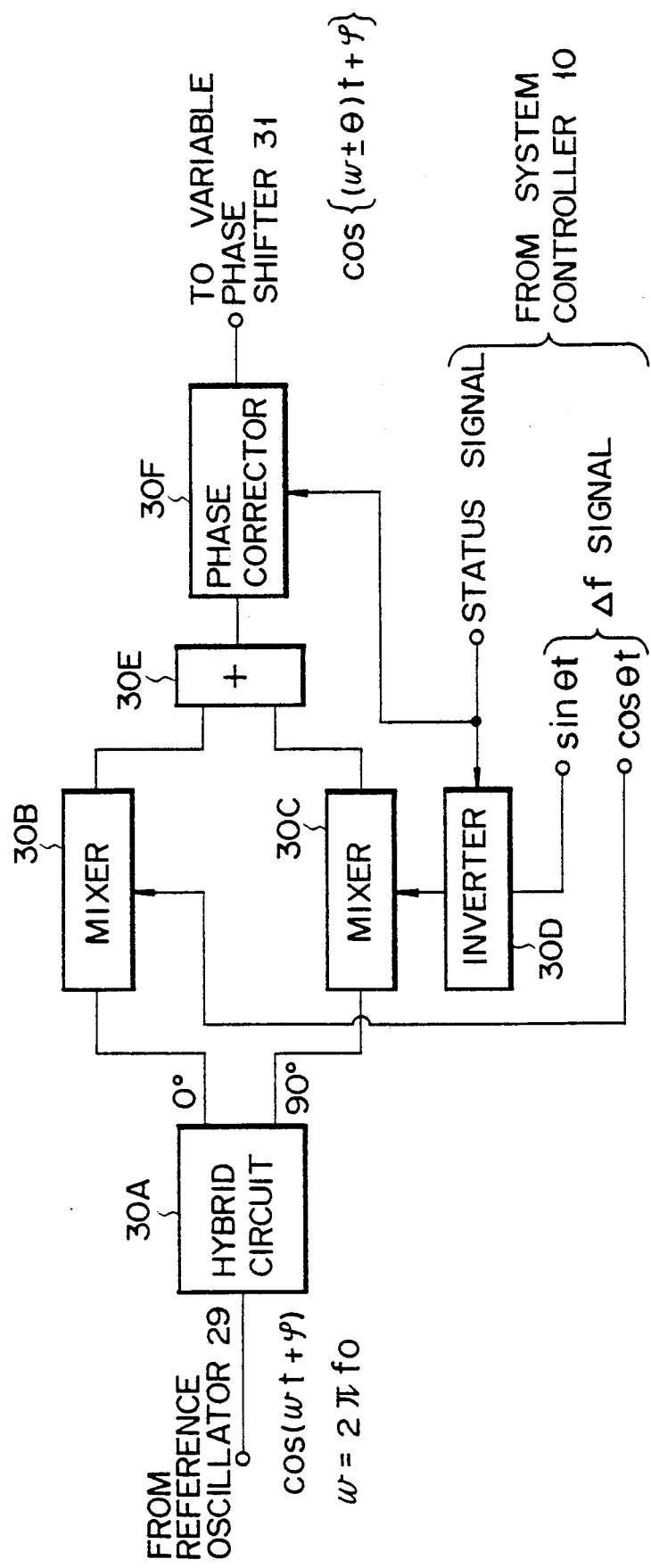
FIG. 10 is a block diagram showing a detailed arrangement of a part of the system in FIG. 9.

FIG. 10 shows a detailed arrangement of the SSB generator 30.

A signal $(\cos(\omega t + \phi))$ (where $\omega = 2\pi fo$) having a frequency fo output from a reference oscillator 29 is supplied to a 90° hybrid circuit 30A. The 90° hybrid circuit 30A outputs 0° and 90° signals $(\cos(\omega t + \phi))$ and $(\sin(\omega t + \phi))$ having a phase difference of 90°. These 0° and 90° signals $(\cos(\omega t + \phi))$ and $(\sin(\omega t + \phi))$ are respectively supplied to mixers 30B and 30C. The Δf signal supplied from the system controller 10 consists of signals $(\sin\theta t)$ and $(\cos\theta t)$ (where $\theta = 2\pi\Delta f$) having a phase difference of 90°. The signal $(\cos\theta t)$ is directly supplied to the mixer 30B, whereas the signal $(\sin\theta t)$ is supplied to the mixer 30C through an inverter 30D. The inverter 30D performs inversion switching of the signal $(\sin\theta t)$ in response to the status signal supplied from the system controller 10. Outputs from the mixers 30B and 30C are added and synthesized by a signal synthesizer 30E. The synthesized signal is then supplied to a variable phase shifter 31 through a phase circuit 30F for compensating for phase discontinuity upon switching of the signal $(\sin\theta t)$. Therefore, a signal $(\cos\{(\omega \pm \theta)t + \phi\})$ having a frequency fo±Δf is supplied to the variable phase shifter 31.

In order to obtain a better result, the frequency characteristics of a probe 7 must be considered.

If a desired distance, i.e., the distance from the center of a field to a position where the center of an image is to be located is represented by ΔL [cm], the center frequency of the reference wave is shifted by an amount given by the following equation:

$$\pm\Delta f = \gamma/2\pi \cdot Gr \cdot \Delta L \text{ [Hz]}$$

where γ is the gyromagnetic ratio [rad/Gauss·s], and Gr is the strength of a read-out gradient field [Gauss·cm]. In ultra high speed MRI, since the reception band is wide (e.g., ~±300 [kHz]), if the Q of the probe 7 is high (e.g., if Q ≈200, an amplitude of $1/\sqrt{2}$ is set at ±160 [kHz]), a reception signal varies in sensitivity and phase for each frequency component, resulting in degradation in image quality.

Figure 11A:
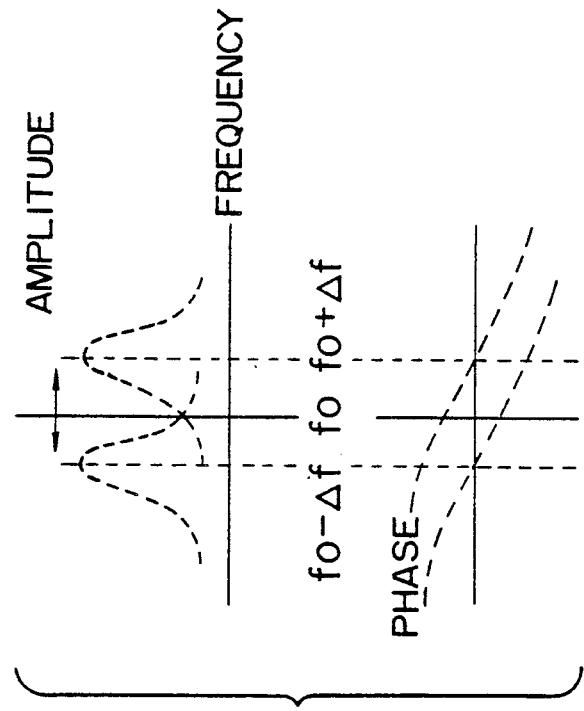
FIGS. 11A and 11B are graphs for explaining a relationship between the frequency characteristics of a probe of the system in FIG. 9 and local zooming in ultra high speed MRI.

As shown in FIG. 11A, an amplitude/phase difference (Δθ) is caused in accordance with a change in reception frequency (fo±Δf) upon switching of a gradient field. In addition, as indicated by dotted lines in FIG. 11A, if the center frequency is shifted because of matching and tuning deviations of the probe 7, the influences of the change in frequency are enhanced.

Moreover, since a band corresponding to a region of interest is deviated from the maximum sensitivity region of the probe 7 upon zooming, such a change in reception frequency is also undesirable in consideration of the S/N (signal-to-noise ratio).

In order to solve such a problem, the tuning center frequency of the probe 7 is switched to coincide with fo±Δf in synchronism with the switching of a gradient field.

Figure 11B:
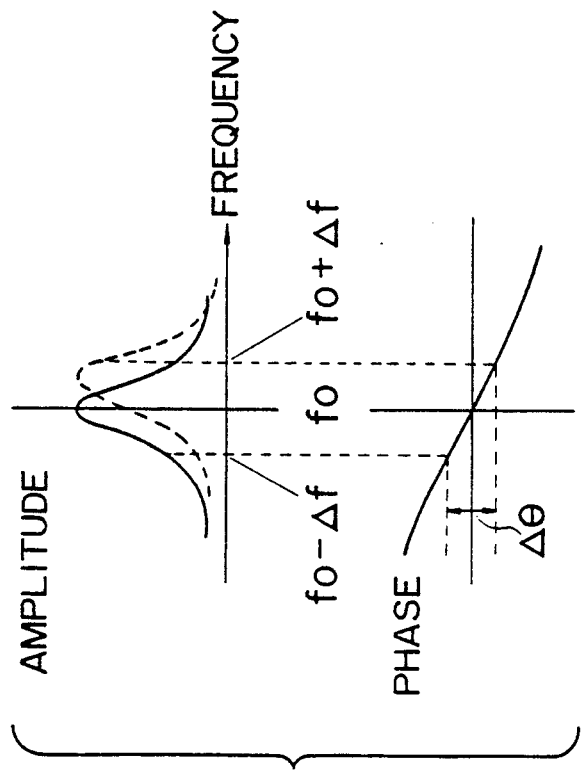

Since switching is required only in a reception mode, a switching operation can be performed by, e.g., variable capacitance diodes or a combination of variable capacitance diodes and a PIN diode (for protecting the variable capacitance diodes in a transmission mode) (in FIG. 11B, a phase difference is also reduced).

Figure 12:
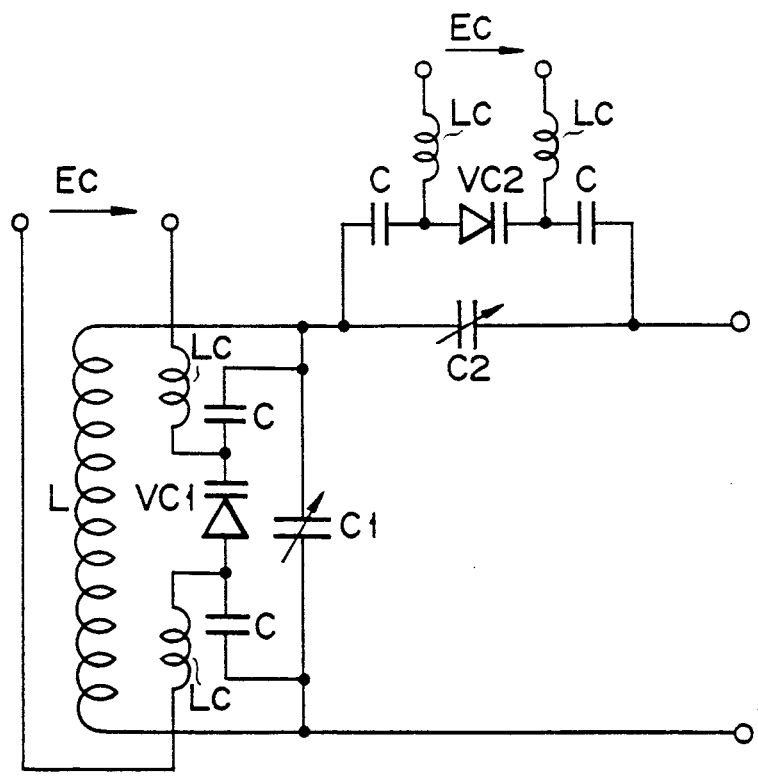
FIGS. 12 and 13 are views each showing an arrangement of a main part of a probe when the relationship between the frequency characteristics of the probe of the system in FIG. 9 and the local zooming in the ultra high speed MRI is considered.

FIG. 12 shows a detailed circuit arrangement in which variable capacitance diodes are used for the probe 7.

A typical equivalent circuit of the probe 7 is constituted by a coil L, a first variable capacitor C1 parallel-connected to the coil L, and a second variable capacitor C2 connected in series with the coil L. Since the tuning center frequency of the probe 7 can be changed by changing the values of the first capacitor C1, and changing the value of second capacitor C2 to keep impedance matching, variable capacitance diodes VC1 and VC2 are respectively parallel-connected to the first and second variable capacitors C1 and C2. In order to separate these variable capacitance diodes VC1 and VC2 from the probe circuit in a DC manner, capacitors C are connected to the two ends of each of the variable capacitance diodes VC1 and VC2. A DC control voltage Ec is applied to the variable capacitance diodes VC1 and VC2 through choke coils Lc connected to the two ends of each of the diodes VC1 and VC2. If an exclusive coil for signal reception is used for the probe 7, the above-described arrangement need not be changed. That is, a decoupling circuit normally used for switching between signal reception and signal transmission is employed in combination with the abovedescribed arrangement.

Figure 13:
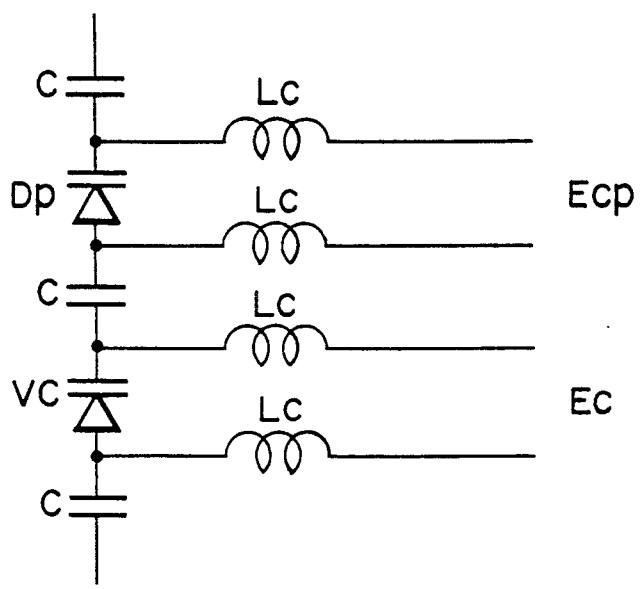

If a coil adapted for both signal transmission and signal reception is used for the probe 7, variable-capacity diodes having a high withstanding voltage are employed. In some cases, a PIN diode is arranged in addition to the variable capacitance diodes in order to protect the variable capacitance diodes in a transmission mode. FIG. 13 shows an example in this case. In order to prevent the application of an overvoltage to a variable capacitance diode VC in a transmission mode, a PIN diode Dp is connected in series with the diode VC (for opening the circuit in a transmission mode). Capacitors C are respectively connected to the two ends of the PIN diode Dp. A DC control voltage Ecp is applied to the two ends of the PIN diode Dp through choke coils Lc.

Alternatively, the Q (quality factor) of the probe 7 may be simply decreased to such an extent that an amplitude/phase difference with respect to a change of fo±Δf can be neglected. In this case, however, since the S/N ratio is inevitably decreased, a negative feedback amplifier is preferably used to prevent a decrease in S/N ratio even if the Q is low. In this case, the Q may be decreased only in a reception mode. The Q of the probe 7 can be decreased by connecting a resistor to the probe 7.

The present invention is not limited to the abovedescribed embodiments. Various changes and modifications can be made within the spirit and scope of the invention. For example, in the embodiments, enlargement zoom imaging is exemplified. However, the present invention can be applied to sequences of spectroscopy, spectroscopic imaging, enlargement zoom spectroscopy combined with local imaging, and enlargement zoom spectroscopic imaging, and other sequences.

The present invention can be applied to sequences of angiography for imaging only a blood vessel and of flow imaging for imaging a blood flow, and combinations of these sequences and the above-described sequences.

What is claimed is:

1. A magnetic resonance imaging system for applying an RF field and slicing, phase encoding, and read-out gradient fields to an object to be examined which is placed in a homogeneous static field in a predetermined sequence, receiving a magnetic resonance signal from a region of interest in the object, causing a synchronous detection circuit to detect the magnetic resonance signal by using a predetermined reference wave, and sampling a detection output from said synchronous detection circuit, thereby acquiring magnetic resonance signal data and obtaining diagnostic data, said magnetic resonance imaging system comprising reference wave control means for shifting a frequency and phase of the reference wave, by predetermined amounts, from a frequency and phase of a magnetic resonance signal when the phase encoding and read-out gradient fields are zero.

2. A system according to claim 1, further comprising means for increasing gradient strengths of the phase encoding and read-out gradient fields to values larger than gradient strength before the shift operation.

3. A magnetic resonance imaging system for applying an RF field and slicing, phase encoding, and read-out gradient fields to an object to be examined which is placed in a homogeneous static field in a predetermined sequence, receiving a magnetic resonance signal from a region of interest in the object through a probe, causing a synchronous detection circuit to detect the magnetic resonance signal by using a predetermined reference wave, and sampling a detection output from said synchronous detection circuit, thereby acquiring magnetic resonance signal data and obtaining diagnostic data, said magnetic resonance imaging system comprising:

sequence control means for executing a sequence to acquire all data needed for an image reconstruction of a slice portion which is excited by said RF field, within a period of relaxing magnetization in the slice portion due to relaxation of transverse magnetization;

frequency control means, controlled by said sequence control means, for shifting a frequency of the reference wave, by a predetermined amount, from a frequency of a magnetic resonance signal when the phase encoding and read-out gradient fields are zero, and for switching polarities of a frequency shift value in synchronism with the switching of the read-out gradient; and phase control means, controlled by said sequence control means, for shifting a phase of the reference wave, by a predetermined amount, from a phase of a magnetic resonance signal when the phase encoding and read-out gradient fields are zero, and for changing gradually a phase shift value in synchronism with the switching of the read-out gradient.

4. A system according to claim 3, wherein said frequency control means includes SSB generating means for mixing a frequency signal having a frequency of a magnetic resonance signal obtained when the phase encoding and read-out gradient fields are zero with a shifting frequency signal having a frequency corresponding to the frequency shift value, and for generating an SSB signal with a additive frequency of both frequencies.

5. A system according to claim 3, wherein said frequency control means includes phase correcting means for compensating for phase continuity with reference to switching polarities of the frequency shift value.

6. A system according to claim 3, wherein said sequence control means includes means for generating the encoding gradient field in a narrow pulsed form on each switching period of the read-out gradient field.

7. A system according to claim 3, further comprising synchronous control means for controlling a center of a tuning frequency of said probe in synchronism with the switching of the read-out gradient.

8. A system according to claim 7, wherein said probe has coil means used for at least receiving the magnetic resonance signal, and said synchronous control means includes a variable capacitor device connected to said coil means.

9. A system according to claim 7, wherein said variable capacitor device is a variable capacitance diode.

10. A system according to claim 7, wherein said probe has coil means used for both transmitting the RF signal and receiving the magnetic resonance signal, and said synchronous control means includes a variable capacitance diode connected to said coil means and a PIN diode for protecting said variable capacitance diode when the RF signal is transmitted.

11. A system according to claim 3, wherein said probe has coil means used for both transmitting the RF signal and receiving the magnetic resonance signal, and means for lowering a Q of the probe to such an extent that amplitude and phase changes caused by frequency changes in a reference wave can be ignored.

12. A system according to claim 3, wherein said probe is exclusively used for receiving the magnetic resonance signal and has a Q which is so low that amplitude and phase changes caused by frequency changes in a reference wave can be ignored.

* * * * *